(12) United States Patent
Kinoshita et al.

(10) Patent No.: US 6,204,636 B1
(45) Date of Patent: Mar. 20, 2001

(54) BATTERY CONTROL APPARATUS FOR HYBRID VEHICLE

(75) Inventors: Naoki Kinoshita; Atsushi Shibutani; Nobuyuki Kawarada; Akira Fujimura, all of Wako (JP)

(73) Assignee: Honda Giken Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/651,066

(22) Filed: Aug. 30, 2000

(30) Foreign Application Priority Data

Aug. 31, 1999 (JP) .................................................. 11-246744

(51) Int. Cl.$^7$ ...................................................... H02J 7/00
(52) U.S. Cl. .......................................... 320/134; 320/136
(58) Field of Search .................................. 320/134, 136, 320/162, 127, 128

(56) References Cited

U.S. PATENT DOCUMENTS

| | | | |
|---|---|---|---|
| 5,698,962 | * 12/1997 | Sakai et al. | 324/431 |
| 5,703,469 | * 12/1997 | Kinoshita | 340/636 |
| 5,926,008 | * 7/2000 | Palanisamy et al. | 320/132 |
| 6,094,051 | * 7/2000 | Palanisamy et al. | 324/426 |

FOREIGN PATENT DOCUMENTS

| | | |
|---|---|---|
| 05087896 | 4/1993 | (JP) . |
| 5-182694 | * 7/1993 | (JP) . |
| 7-014613 | * 1/1995 | (JP) . |

OTHER PUBLICATIONS

Battery Memory Effect Detection System, IBM Technical Disclosure Bulletin, Jun. 1, 1994, vol. 37, issue 6B, p. 569–570.*

* cited by examiner

Primary Examiner—Peter S. Wong
Assistant Examiner—Gregory J Toatley Jr.
(74) Attorney, Agent, or Firm—Arent Fox Kintner Plotkin & Kahn, PLLC (57) ABSTRACT

The present invention provides a battery control apparatus for a hybrid vehicle, which is capable of improving the time of continuous availability for use of the battery by controlling the amount of charge/discharge in accordance with a change in the voltage characteristic of the battery. The hybrid vehicle comprises a combustion engine for outputting driving force of the vehicle, an electric motor for generating a force for assisting the output from the engine, and a battery for supplying power to the motor and for storing energy regenerated by the motor acting as a generator when the assisting force is not required. The battery control apparatus for controlling the battery comprises a remaining battery charge calculator for calculating a remaining charge of the battery, a memory effect detector for detecting the occurrence of the memory effect in the battery, a use permission zone determining device for determining the use permission zone of the remaining charge of the battery in accordance with the occurrence of the memory effect, and a charge/discharge amount controller for controlling an amount of charge/discharge in the use permission zone of the remaining charge of the battery.

3 Claims, 9 Drawing Sheets

BATTERY CONTROL APPARATUS FOR HYBRID VEHICLE

BACKGROUND OF THE INVENTION

1. Field of the Invention

The present invention relates to a battery control apparatus for controlling a battery mounted in a hybrid vehicle, more particularly to a battery control apparatus for controlling the amount of charging/discharging in accordance with the remaining charge of the battery using a nickel compound.

This application is based on Japanese Patent Application No. Hei 11-246744 (Unpublished), the contents of which are incorporated herein by reference.

2. Description of the Related Art

Conventionally, hybrid vehicles equipped with a motor in addition to an engine as a power source for driving are known. Hybrid vehicles include series hybrid vehicles and parallel hybrid vehicles. In series hybrid vehicles, a motor is driven by the generated output of a generator driven by an engine, and the wheels are driven by the motor. As described above, the engine and the wheels are not mechanically coupled to each other in series hybrid vehicles. Therefore, the engine can be operated at an almost constant RPM reducing fuel consumption and emissions, to provide lower fuel consumption and emissions than can be achieved by conventional engine vehicles.

As opposed to series hybrid vehicles, in parallel hybrid vehicles, a motor coupled to an engine supplements the driving of the driving shaft by the engine, and electric energy obtained by using the motor as a generator is stored in a power storage unit. In addition, the generated electric energy is used for electrical equipment installed in the vehicles. As described above, since the parallel hybrid vehicle can also reduce the drive load of the engine, lower fuel consumption and emissions, compared to conventional engine vehicles, can also be achieved.

The parallel hybrid vehicle includes a type in which the motor which supplements the output of the engine is directly coupled to the output shaft of the engine, and the motor functions as a generator during deceleration and stores the generated electricity in a battery, and a type in which driving force is generated by use of both, or one of, an engine and a motor, and a generator is provided separately.

In such hybrid vehicles, various kinds of controls are performed in such manner that the motor supplements the output of the engine during acceleration, and electricity is stored in the battery by deceleration regeneration during deceleration. This makes it possible to respond to the requirements of the driver while providing electrical energy to the battery (hereinafter referred to as "remaining battery charge" or "state of charge").

The batteries used in hybrid vehicles often use nickel compounds in their positive electrode. In batteries using a nickel compound, a phenomenon in which an electromotive force value for the remaining battery charges changes due to repeated cycles of charging and discharging occurs. This phenomenon is referred to as a "memory effect" below. The memory effect has the characteristic that it is apt to occur in a battery using a nickel compound when the battery is repeatedly recharged before it has reached a completely discharged state, or repeatedly discharged before it has reached a completely charged state.

The batteries used in hybrid vehicles are controlled so as to be charged and discharged in the middle range of their remaining charge, to provide a long lifetime and high efficiency. For this reason, the batteries never reach the completely discharged state or the completely charged state, and they tend to develop a memory effect.

Since a range of the remaining battery charge available is narrowed by the occurrence of the memory effect, there is the problem that the time during which an operation for continuously supplementing the driving force of the engine and an operation for charging the battery by a deceleration regeneration can be continuously performed is reduced. Moreover, if the charge/discharge is performed only in a middle area of the remaining battery charge in a state in which the memory effect has occurred, the memory effect will further occur, and the range of the remaining battery charge available is reduced, resulting in a vicious cycle.

SUMMARY OF THE INVENTION

The present invention was made in view of the above circumstances, and the object of the present invention is to provide a battery control apparatus for a hybrid vehicle capable of extending the time over which the battery is continuously available, by controlling the amount of charge/discharge depending on a change in the voltage characteristics of the battery.

In the first aspect of the present invention, a battery control apparatus (for example, a battery control apparatus 9 in the embodiment) for a hybrid vehicle with a combustion (an engine 1) for outputting driving force of the vehicle, an electric motor (a motor 2) for generating a force for assisting the output from the engine, and a battery (a battery 8) for supplying power to the motor and for storing energy regenerated by the motor acting as a generator when the assisting force is not required, the battery control apparatus comprising: a remaining battery charge calculator (a remaining battery charge calculating section 91) for calculating a remaining charge of the battery; a memory effect detector (a memory effect detecting section 93) for detecting the occurrence of the memory effect in the battery; a use permission zone determining device (a use permission zone determining section 94) for determining a use permission zone of the remaining charge of the battery in accordance with the occurrence of the memory effect; and a charge/discharge amount controller (a charge/discharge controlling section 92) for controlling an amount of charge/discharge in the use permission zone of the remaining charge of the battery.

With the above described constitution, when the voltage characteristic of the battery change due to the memory effect, the use permission zone of the remaining battery charge can be enlarged. Accordingly, the effect that the time of continuous availability for use of the battery can be lengthened is obtained. As a result, it is possible to prevent reductions of the time of continuous availability for the driving force supplementation operation for the engine and the charging operation to the battery by deceleration regeneration. Moreover, since enlarging the use permission zone makes it possible to allow the battery to approach to the completely charged state or the completely discharged state, the effect that the memory effect can be reversed is obtained.

A battery control apparatus according to a second aspect of the present invention further comprises a remaining battery charge correcting device (the remaining charge correcting section 91c) for detecting a voltage of the battery, comparing the detected voltage with a determination voltage corresponding to the remaining battery charge of a predetermined value, and correcting the remaining charge calculated by the remaining battery charge calculator to the predetermined value based on the comparison result of the detected voltage and the determination voltage, wherein, the use permission zone determining device changes the determination voltage when the remaining battery charge is corrected, in accordance with the occurrence of the memory effect.

With such a constitution, the effect that processing for calculating the remaining battery charge and correcting the remaining battery charge can be performed in the same way regardless of the occurrence of the memory effect, can be obtained.

A battery control apparatus according to a third aspect of the present invention further comprises a remaining battery charge correcting device (the remaining battery charge correcting section 91c) for detecting a voltage of the battery, comparing the detected voltage with a determination voltage corresponding to the remaining battery charge of a predetermined value, and correcting the remaining charge calculated by the remaining battery charge calculator to the predetermined value based on the comparison result of the detected voltage and the determination voltage, wherein, the use permission zone determining device changes the predetermined value of the remaining charge when the remaining charge of the battery is corrected, in accordance with the occurrence of the memory effect.

With such constitution, since it is unnecessary to store a plurality of determination voltage maps based on the battery temperature, battery current and battery voltage, the effect that the storage capacity of the battery control apparatus can be made to be small, can be obtained.

DETAILED DESCRIPTION OF THE PREFERRED EMBODIMENTS

A battery control apparatus for a hybrid vehicle according to each embodiment of the present invention will be described with reference to the accompanying drawings below.

Figure 1:
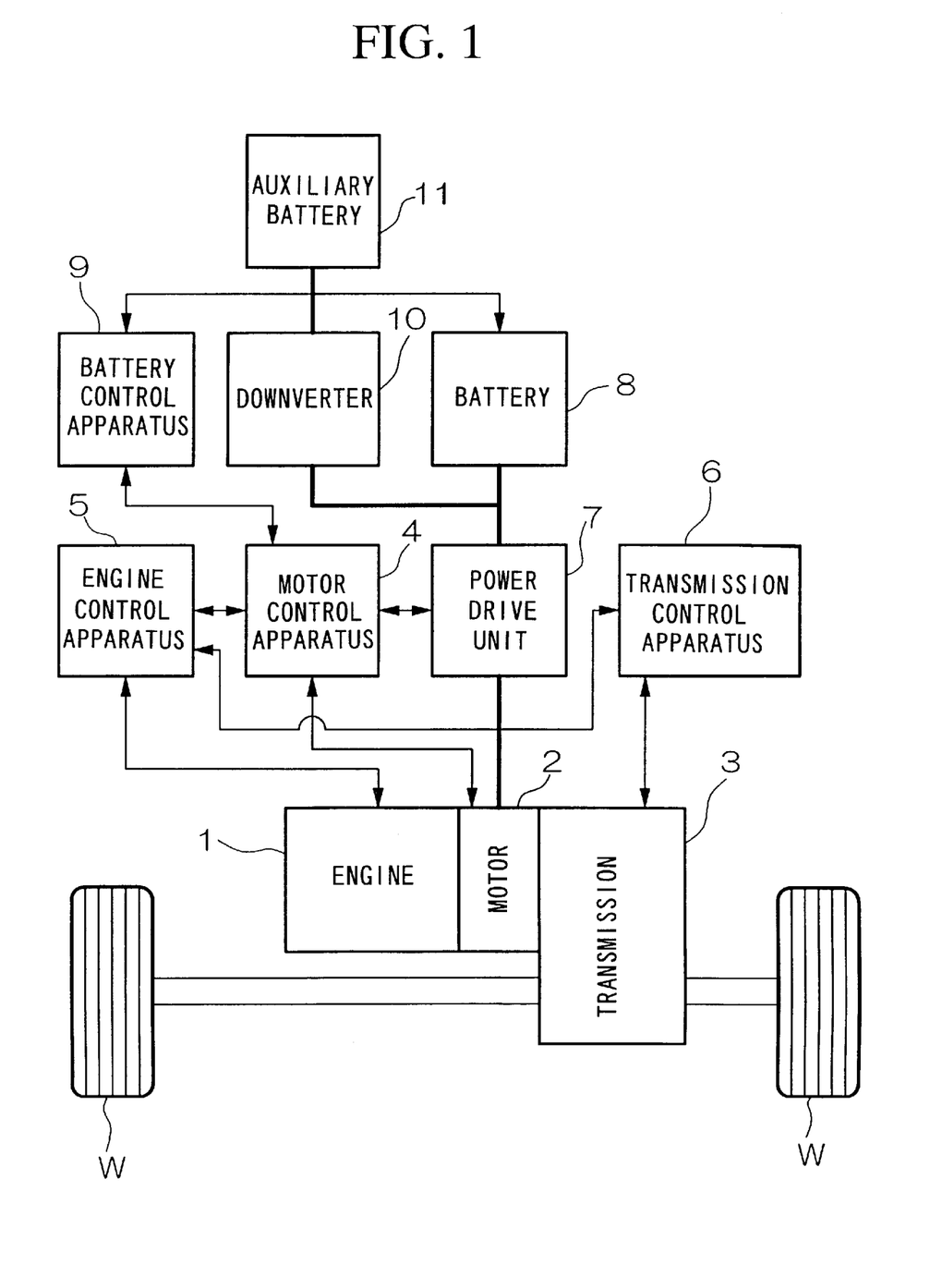
FIG. 1 is a block diagram showing the overall constitution of a hybrid vehicle.

FIG. 1 is a block diagram showing the overall constitution of the hybrid vehicle according to the each embodiment of the present invention. In FIG. 1, reference numeral 1 denotes an internal combustion engine, which is simply referred to as an engine in the following descriptions and drawings. Reference numeral 2 denotes an electric motor, which is simply referred to a motor in the following descriptions and drawings. This motor 2 supplements the engine output in accordance with the driving conditions of the vehicle, and performs regeneration in decelerating the vehicle. Reference numeral 3 denotes a transmission which is either a manual transmission or an automatic transmission. The transmission 3 includes a clutch, a torque converter, a forward/backward movement switching mechanism, a speed change gear mechanism, a differential gear and the like. The transmission 3 transmits driving forces of the engine 1 and the motor 2 to the driving wheels W, W.

Reference numeral 4 denotes a motor control apparatus for controlling the rotation of the motor 2. Reference numeral 5 denotes an engine control apparatus for controlling the engine 1. Reference numeral 6 denotes a transmission control apparatus for controlling the transmission 3. Reference numeral 7 denotes a power drive unit for supplying/receiving electric power to/from the motor 2 based on a control signal from the motor control apparatus 4. Reference numeral 8 denotes a high voltage system battery for supplying electric power to the motor 2 and storing regenerated energy generated by regeneration of the motor 2 therein when a driving force is unnecessary. The high voltage system battery 8 is one battery constituted by connecting a plurality of battery modules. Reference numeral 9 denotes a battery control apparatus for monitoring the state of the battery 8 and controlling the amount of charging/discharging in accordance with the state of the battery 8. Reference numeral 10 denotes a downverter for reducing the voltage of the battery 8 to output it. Reference numeral 11 denotes a 12V system auxiliary battery for supplying electrical power to electrical equipment used in the vehicle. The electrical power of the battery 8 is charged in the auxiliary battery 11 via the downverter 10.

A throttle opening degree sensor (not shown) and an engine speed sensor (not shown) are provided in the engine 1, and the outputs of these sensors are input to the motor control apparatus 4. A voltage sensor (not shown), a current sensor (not shown) and a temperature sensor (not shown) are provided in the battery 8, and the outputs of these sensors are input into the battery control apparatus 9.

First Embodiment

Figure 2:
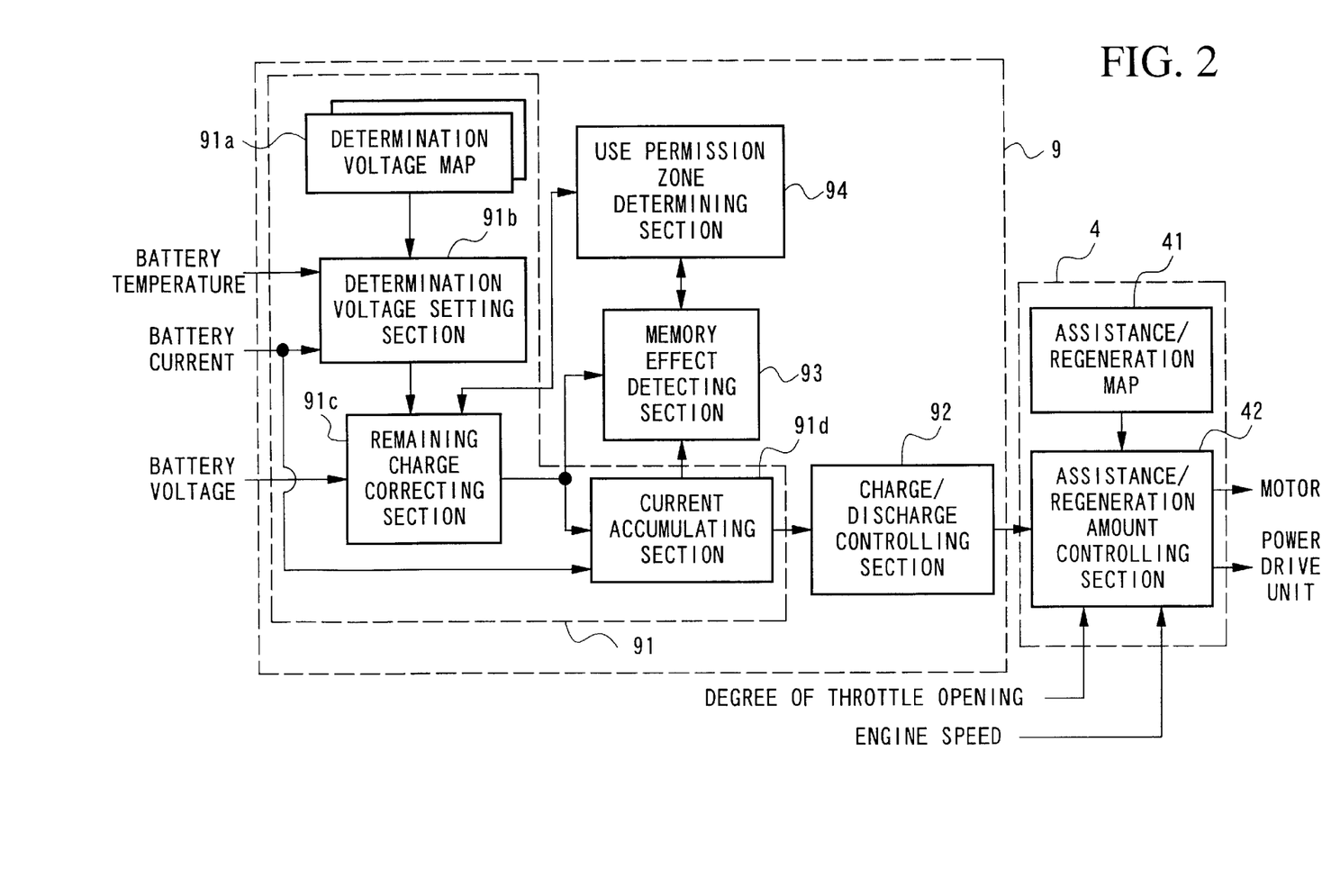
FIG. 2 is a block diagram showing the constitution of the motor control apparatus 4 and battery apparatus 9 shown in FIG. 1, in a first embodiment of the present invention.

Next, a description of the constitution of the motor control apparatus 4 and the battery control apparatus 9 according to the first embodiment of the present invention will be given. FIG. 2 is a block diagram showing the constitution of the motor control apparatus 4 and the battery control apparatus 9 shown in FIG. 1. In FIG. 2, reference numeral 41 denotes an assistance/regeneration map in which the control amount, which is used when the motor 2 generates auxiliary driving force to assist the engine 1, or carries out regeneration, is stored. Note that in the following descriptions, to supplement the driving force of the engine 1 is referred to as "assistance", and to store the regenerated energy generated by regeneration of the motor 2 is referred to as "regeneration". In the assistance/regeneration map 41, a control amount used for generating a driving force supplementation and performing a regeneration operation, based on the degree of throttle opening (e.g., the extent of the throttle opening) and an engine speed of the engine 1, is defined.

Reference numeral 42 denotes an assistance/regeneration amount controlling section, which refers to the assistance/regeneration map 41 and determines the assistance amount or the regeneration amount based on the degree of throttle opening and the engine speed, thus controlling the motor 2 and the power drive unit 7.

Reference numeral 91 denotes a remaining battery charge calculating section for calculating the remaining battery charge of the battery 8, which is composed of a determination voltage map 91a, a determination voltage setting section 91b, a remaining charge correcting section 91c and a current accumulating section 91d. The current accumulating section 91d accumulates a charge/discharge current, which is detected by the current sensor provided in the battery 8, and calculates the remaining battery charge. Furthermore, the remaining charge correcting section 91c determines whether a battery voltage detected by the voltage sensor provided in the battery 8 is equal to a determination voltage described later, and, based on the determination result, corrects (resets) the remaining battery charge calculated by the current accumulating section 91d. The correction (resetting) of the remaining battery charge is performed to correct an accumulation error of the charge/discharge current. The determination voltage in this embodiment means a threshold value set by the determination voltage setting section 91b. The determination voltage setting section 91b refers to the determination voltage map 91a, and sets the determination voltage based on the outputs of the temperature sensor and the current sensor, which are provided in the battery 8, thus notifying the remaining charge correcting section 91c of the determination voltage. The determination voltage map 91a is provided with two maps: one is referred to when the memory effect has not occurred and the other is referred to when the memory effect has occurred.

Reference numeral 92 denotes a charge/discharge controlling section, which determines the possible amount of a charging/discharging based on the remaining battery charge calculated by the remaining battery charge calculating section 91, and permits the assistance/regeneration amount controlling section 42 to perform "assistance" or "regeneration". Reference numeral 93 denotes a memory effect detecting section, which detects, based on the output of the remaining charge correcting section 91c and the current accumulating section 91d, whether the memory effect has occurred in the battery 8. Reference numeral 94 denotes a use permission zone determining section, which determines a use permission zone of the battery 8 depending on the detection result of the memory effect detecting section 93.

Here, the remaining battery charge of the battery 8 will be explained. The remaining battery charge of the battery 8 is a value calculated by referring to the voltage of the battery, the charge/discharge current and the temperature of the battery in the battery control apparatus 9. The battery control apparatus 9 controls the amount of charge/discharge of the battery 8 based on the value of this remaining battery charge. In accordance with this remaining battery charge, the control of the battery 8 is divided into three zones; a charge inhibition zone, a discharge inhibition zone and a use permission zone.

Among these zones, the charge inhibition zone is a zone where there is a possibility of an overcharge when the battery is charged to a predetermined level or more. In the charge inhibition zone, the remaining battery charge ranges, for example, from 80 to 100%. On the other hand, the discharge inhibition zone is a zone where there is a possibility of over-discharge when the battery is discharged to a predetermined level or more. In the discharge inhibition zone, the remaining battery charge ranges, for example, from 0 to 20%. The use permission zone is a zone where both charging and the discharging are permitted. In the use permission zone, the remaining battery charge ranges, for example, from 20 to 80%. The battery control apparatus 9 controls the amount of charging and the amount of discharging so that the remaining battery charge is always within this use permission zone.

The limits of these zones are values determined in accordance with the performance of the battery used. A correlation exists between the battery voltage and the remaining battery charge, and as the remaining battery charge becomes larger, the battery voltage becomes higher. When the remaining battery charge is intermediate (about 20 to 80%), the change in battery voltage for a change in remaining battery charge is small. When the remaining battery charge exceeds a predetermined value (about 80%), the increase in the battery voltage becomes notable. When the remaining battery charge is reduced to a predetermined value (about 20%) or less, the decrease of the battery voltage becomes notable. Based on these facts, the remaining charge correcting section 91c shown in FIG. 2 can estimate the remaining battery charge by detecting a phenomenon in which the increase or decrease of the battery voltage becomes notable.

Since the voltage change of the battery 8 for a change in the remaining battery charge is small in the use permission zone, in the use permission zone the current accumulating section 91d shown in FIG. 2 accumulates the amount of charge and amount of discharge of the battery 8, and calculates the remaining battery charge. However, a detection error in detecting the current is also accumulated in the technique to calculate the remaining battery charge by the accumulation of the current. Therefore, when the battery is used within the use permission zone without reaching to the upper and lower limits of the use permission zone, the error in the calculated remaining battery charge becomes large. Accordingly, the remaining charge correcting section 91c resets the remaining battery charge calculated by the current accumulating section 91d using the correction value, which cancels the detection error of the remaining battery charge due to the accumulation error of the charge/discharge current. The resetting of the accumulation error can be realized by replacing the remaining battery charge with a predetermined value (this value is 20% or 80%) just as the phenomenon that the increase or decrease of the battery voltage becomes notable is detected.

In the remaining battery charge calculating section 91, the upper and lower limits of the battery voltage when the remaining battery charge reaches a predetermined value are stored in the determination voltage map 91a, in response to combinations of the battery temperature and the battery charge/discharge current. The determination voltage setting section 91b refers to the determination voltage map 91a, and obtains the battery voltage when the remaining battery charge reaches the above predetermined value, based on the battery temperature and the battery charge/discharge current at the present moment. The obtained battery voltage is sent to the remaining charge correcting section 91c, and the replacement of the remaining battery charge is performed.

Next, the operation to calculate the remaining battery charge of the battery 8 will be explained with reference to FIG. 3, which is a flowchart showing the operation carried out when the remaining battery charge calculating section 91 shown in FIG. 2 calculates the remaining battery charge.

First, the remaining battery charge correcting section 91c detects the voltage of the battery 8 (step S31). At this time, the output of the voltage sensor (not shown) is used for the voltage detection. Subsequently, the remaining battery charge correcting section 91c determines whether the detected voltage value is lower than the lower limit of the battery voltage value (step S32). This lower limit of the battery voltage value is a battery voltage value when the remaining battery charge becomes equal to a predetermined lower limit, and is provided by the determination voltage setting section 91b. The determination voltage setting section 91b obtains the lower limit of the battery voltage value by referring to the determination voltage map 91a based on the battery temperature and the battery charge/discharge current, If the detected voltage value is equal to the lower limit of the battery voltage value or more, the remaining battery charge correcting section 91c determines whether the detected voltage value is higher than the upper limit of the battery voltage value or not (step S33). The upper limit of the voltage value here is the battery voltage value when the remaining battery charge becomes equal to a predetermined upper limit, and is obtained by referring to the determination voltage map 91a based on the battery temperature and the battery charge/discharge current.

If the detected voltage value is equal to the lower limit of the battery voltage value or more, the remaining charge correcting section 91c determines whether the detected voltage is higher than the upper limit of the battery voltage value or not (step S33). The upper limit of the battery voltage value here is the battery voltage value when the remaining battery charge becomes equal to a predetermined upper limit, and is obtained by referring to the determination voltage map 91a based on the battery temperature and the battery charge/discharge current.

If the detected voltage value is equal to the upper limit of the battery voltage value or lower, the current accumulating section 91d detects the charge/discharge current (step S34). The current sensor is used for the detection of this charge/discharge current, and the amount of charge current and the amount of discharge current are separately detected.

Next, the current accumulating section 91d accumulates the charge/discharge current value detected in the step S34 (step S35). In this accumulation, the amount of charge and the amount of discharge are accumulated separately. Specifically, when the battery 8 is discharged, the discharge current detected is subtracted from the accumulation value of the discharge current, and when the battery 8 is charged, a predetermined charge efficiency (for example, 0.95) is multiplied by the detected charged current, and the obtained value is added to the accumulation value of the charge current.

Next, the current accumulating section 91d calculates the present remaining battery charge from the accumulation value of the charge/discharge current and the initial value of the remaining battery charge (step S36). The initial value of the remaining battery charge here is the remaining battery charge as updated in every iteration case by the process shown in FIG. 3, and stored in the current accumulating section 91d. The initial value of the remaining battery charge is stored in the current accumulating section 91d even when the ignition switch of the vehicle is turned OFF, and read out when the ignition switch is turned ON.

On the other hand, in the step S32, if the battery voltage is lower than the lower limit of the battery voltage, the remaining charge correcting section 91c instructs the current accumulating section 91d to replace the present remaining battery charge with the use permission lower limit (step S39). The use permission lower limit is the lower limit of the remaining battery charge in the above described use permission zone, and the use permission lower limit of the remaining battery charge is set to 20%. Thus, the current accumulating section 91d replaces the remaining battery charge with the lower limit of the use permission zone, and resets the accumulation value of the charge/discharge current.

Furthermore, in the step S33, if the battery voltage is higher than the upper limit of the battery voltage value, the remaining charge correcting section 91c instructs the current accumulating section 91d to replace the present remaining battery charge with the use permission upper limit (step S38). The use permission upper limit here is the upper limit of the remaining battery charge in the use permission zone, and the use permission upper limit of the remaining battery charge is set to 80%. Thus, the current accumulating section 91d replaces the remaining battery charge with the upper limit of the use permission zone, and resets the accumulation value of the charge/discharge current.

Next, the current accumulating section 91d outputs the remaining battery charge calculated or set in the steps S36, S38 and S39 to the charge/discharge controlling section 92 (step S37).

Figure 3:
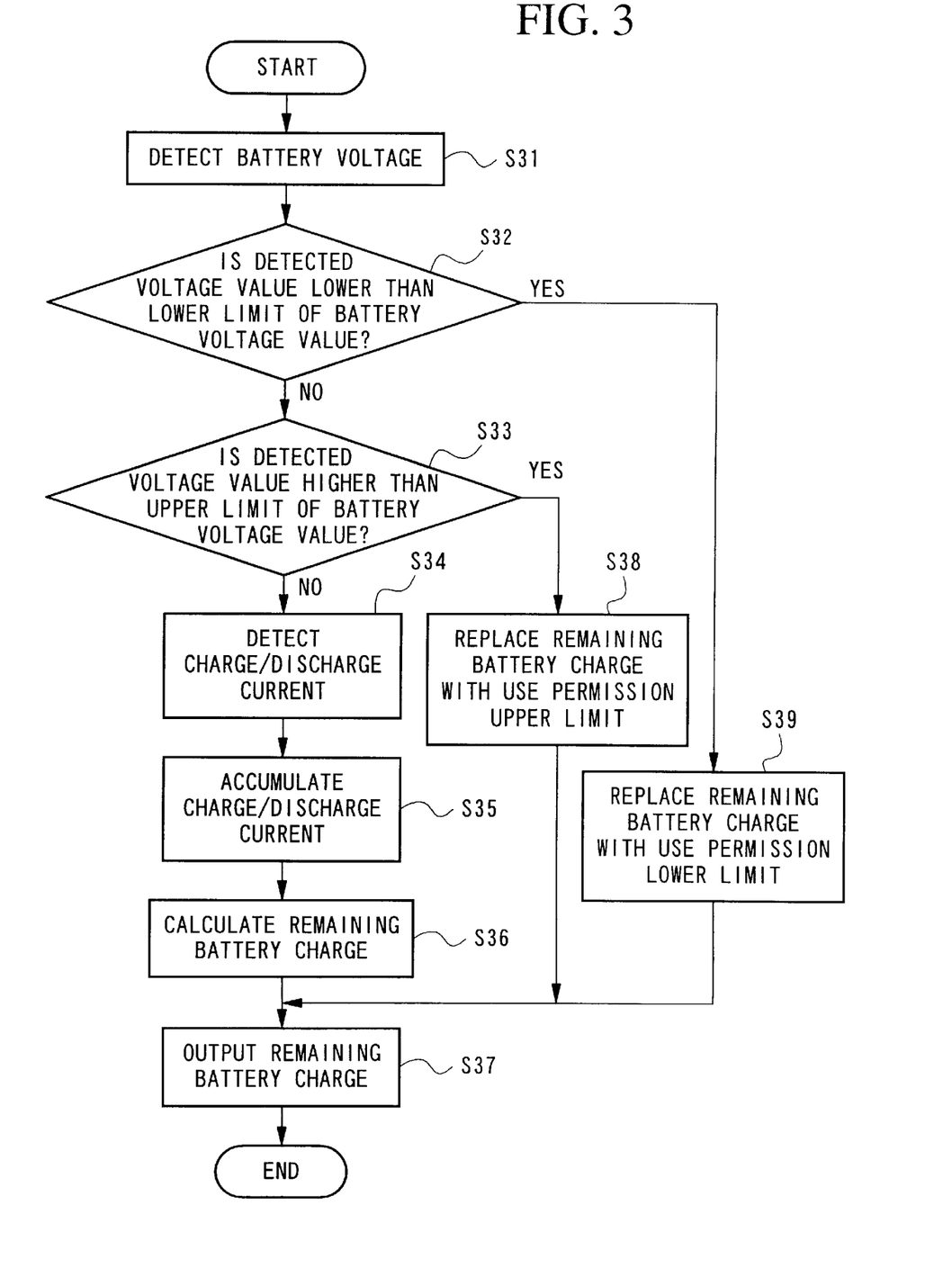
FIG. 3 is a flowchart showing an operation in which the remaining battery charge calculating section 91 shown in FIG. 2 calculates the remaining battery charge.

The remaining battery charge calculating section 91 executes repeatedly the processing of steps S31 to S39 shown in FIG. 3 at certain intervals. These intervals are determined by the time required for the operation to detect the battery voltage and the time required for the operation to detect the charge/discharge current to accumulate it.

As described above, the remaining battery calculating section 91 calculates or sets the remaining battery charge of the battery 8 by the voltage detection of the battery 8 or the accumulation of the charge/discharge current, and outputs the result to the charge/discharge controlling section 92. As the remaining battery charge output at this time, a value of 20 to 80% is output. The charge/discharge controlling section 92 reads out the remaining battery charge output from the remaining battery charge calculating section 91, and controls the amount of charge/discharge based on the remaining battery charge.

Figure 10:
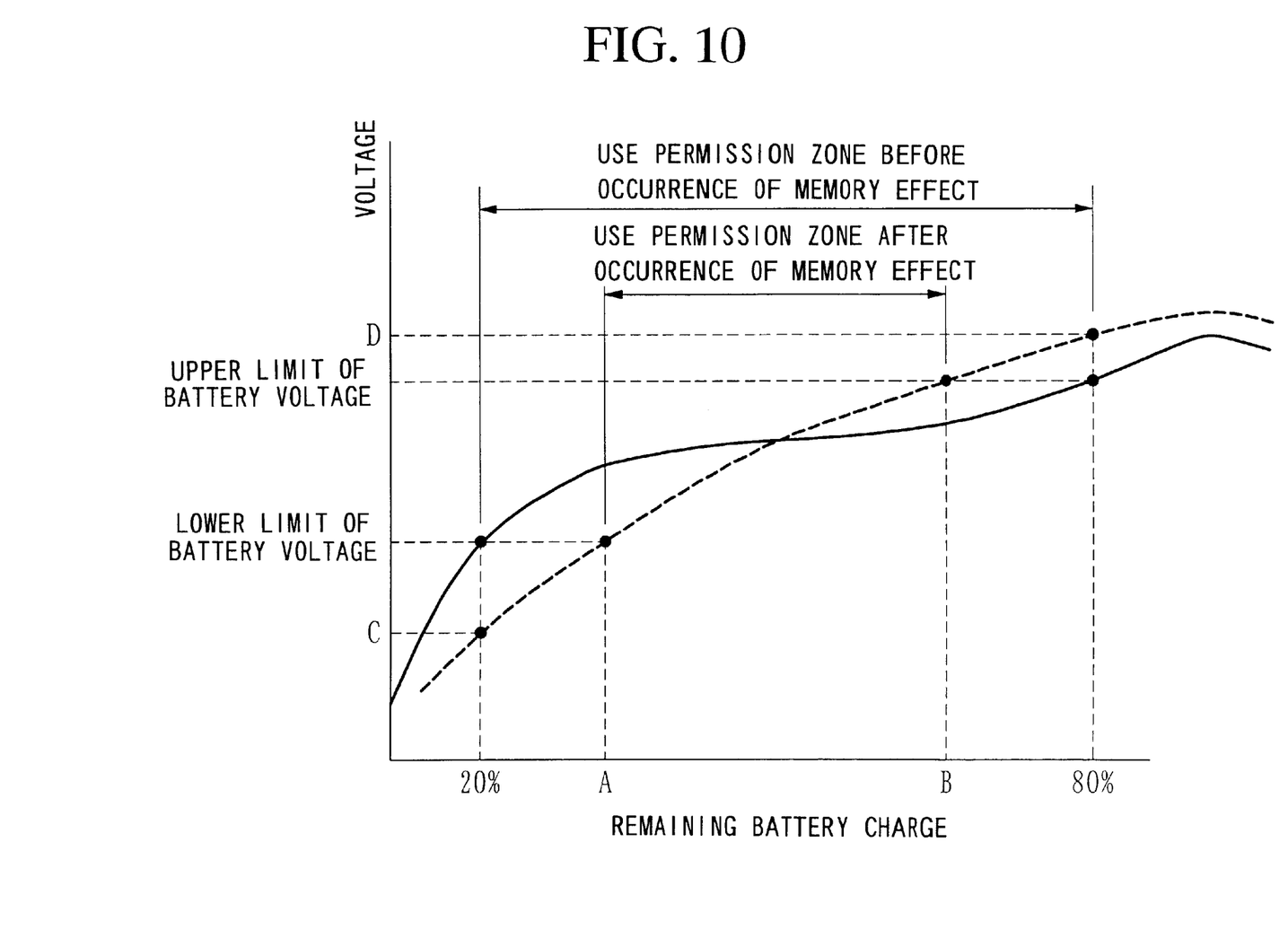
FIG. 10 is a graph explaining the memory effect occurring in the battery.

Here, conditions in which the use permission zone change due to occurrence of the memory effect in a battery using a nickel compound will be briefly explained with reference to FIG. 10, which is a graph showing the changes in the voltage characteristic before and after the occurrence of the memory effect in the battery using the nickel compound. In FIG. 10, the X-axis represents the remaining battery charge, and the Y-axis represents the battery voltage. The solid line represents the voltage characteristic before the occurrence of the memory effect, and the dotted line represents the voltage characteristic after the occurrence of the memory effect. The lower limit of the battery voltage value and the upper limit of the battery voltage value are set in the determination voltage map 91a shown in FIG. 2 so that the use permission zone ranges from 20 to 80% using the characteristic (characteristic before the occurrence of the memory effect) of FIG. 10.

However, once the memory effect has occurred in the battery, the difference between the voltage when the remaining battery charge is small and the voltage when the remaining battery charge is large becomes large. Accordingly, the remaining battery charge is equal to the value represented by the symbol A in FIG. 10 just as the lower limit of the battery voltage value, which is set when the memory effect does not occur, is detected. Similarly, just as the upper limit of the battery voltage value is detected, the remaining battery charge is equal to the value represented by the symbol B in FIG. 10. Therefore, the use permission zone in this case ranges from A to B, and it is narrower compared to a usual battery in which the memory effect has not occurred. In addition, when charging and discharging is repeated so that the use permission zone is set to the range from A to B shown in FIG. 10 and does not exceed this range, the battery after the occurrence of the memory effect has the feature that the memory effect further occurs and the use permission zone is further narrowed.

However, when memory effect occurs in a battery using a nickel compound, if it has occurred on the charging side, it can be reversed by a full charge, and if it has occurred on the discharging side, it can be reversed by a full discharge.

Figure 4:
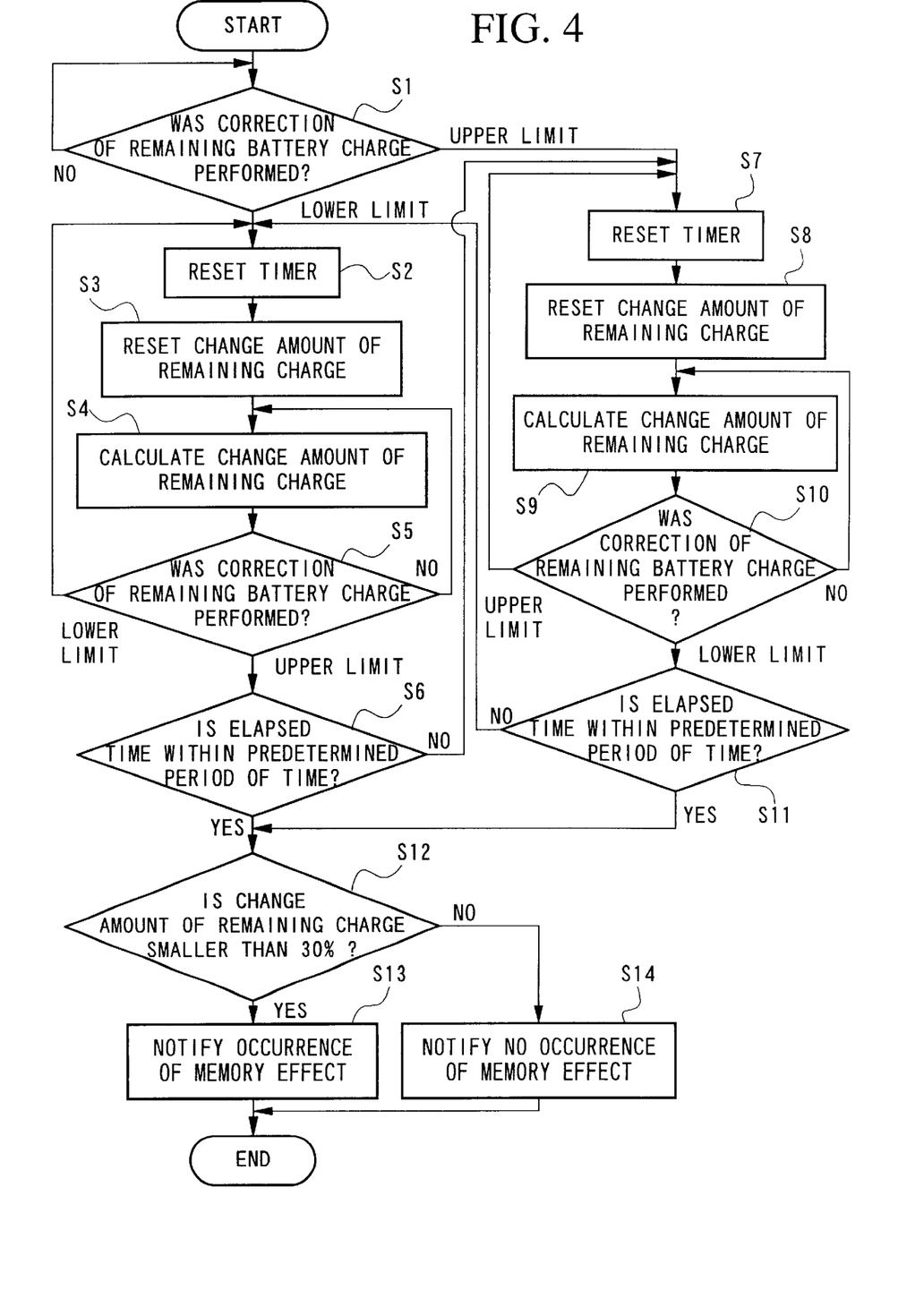
FIG. 4 is a flowchart showing an operation in which the memory effect detecting section 93 shown in FIGS. 2 and 5 detects the memory effect.

Next, the operation of the memory effect detecting section 93 of FIG. 2 to detect whether the memory effect has occurred in the battery 8 will be described with reference to FIG. 4, which is a flowchart showing an operation carried out when the memory effect detecting section 93 detects the memory effect, and the process shown in FIG. 4 is executed simultaneously with the process shown in FIG. 3.

First, the memory effect detecting section 93 determines whether the correction (reset) of the remaining battery charge was performed in the remaining charge correcting section 91c (step S1). If the correction of the remaining battery charge was not performed, the step S1 is executed again. On the other hand, if the correction of the upper limit of the remaining battery charge was performed, the process moves to the step S7.

If the correction of the lower limit of the remaining battery charge was performed, the memory effect detecting section 93 resets an internal timer (step S2). Next, the memory effect detecting section 93 resets a variable for obtaining the amount of change of the remaining battery charge (step S3). This reset operation is performed in such manner that the present value of the charge/discharge current accumulation is read from the current accumulating section 91d and the charge/discharge current accumulating value is used as a reset value. Specifically, since the lower limit of the remaining battery charge is being corrected at this time, the output value of the current accumulating section 91d should already be corrected to be 20% by the remaining charge correcting section 91c. Accordingly, the reset value is 20%.

Next, the memory effect detecting section 93 reads the present remaining battery charge from the current accumulating section 91d, and calculates amount of change of the remaining battery charge based on the remaining battery charge and the reset value (step S4). The amount of change is a value showing how much the present remaining battery charge increases or decreases relative to the reset value (here 20%). Here, the amount of charge is the value showing how much the remaining battery charge increases. Accordingly, a value obtained by subtracting the reset value from the present remaining battery charge is the change value of the remaining battery charge.

Next, the memory effect detecting section 93 determines whether the correction (reset) of the remaining battery charge was performed in the remaining charge correcting section 91c (step S5). If the correction of the remaining battery charge was not performed, the process returns to the step S4, and the amount of change of the remaining battery charge is newly calculated. When the correction of the lower limit of the remaining battery charge is performed again, the processing returns to the step S2.

On the other hand, if the correction of the upper limit of the remaining battery charge was performed, the memory effect detecting section 93 refers to the internal timer, and determines whether the elapsed time from the performance of the timer reset in the step S2 to the present time is within a predetermined period of time (step S6). Note that the predetermined period of time here is the maximum time in which the foregoing accumulation error is considered to be within the range of allowable error anticipated and the predetermined period of time here is set to 120 minutes.

As a result of this determination, if the elapsed time is within the predetermined period of time (120 minutes), the process proceeds to the step S12. On the other hand, if the elapsed time exceeds the predetermined period of time (120 minutes), the memory effect detecting section 93 determines that the precision of the amount of change of the remaining battery charge calculated in the step S4 is low, and resets the internal timer (step S7).

Next, the memory effect detecting section 93 resets the variable for obtaining the amount of change of the remaining battery charge again (step S8). In this case, since the reset of the variable is performed when the correction of the upper limit of the remaining battery charge is performed, the output value of the current accumulating section 91d should be corrected so as to be 80% by the remaining charge correcting section 91c. Accordingly, the reset value becomes 80%.

Next, the memory effect detecting section 93 reads the present remaining battery charge from the current accumulating section 91d, and calculates the amount of change of the remaining battery charge based on the remaining battery charge and the reset value (step S9). The amount of change is a value showing how much the present remaining battery charge is increased or decreased (in this case, it is decreased) relative to the reset value (here 80%). Accordingly, the value obtained by subtracting the present remaining battery charge from the reset value is the amount of change of the remaining battery charge.

Next, the memory effect detecting section 93 determines whether the correction (reset) of the remaining battery charge was performed in the remaining charge correcting section 91c (step S10). If the correction of the remaining battery charge was not performed, the process returns to the step S9, and the amount of change of the remaining battery charge is newly calculated. When the correction of the upper limit of the remaining battery charge is performed again, the process returns to the step S7.

On the other hand, if the correction of the lower limit of the remaining battery charge was performed, the memory effect detecting section 93 refers to the internal timer, and determines whether the elapsed time from the performance of the timer reset in the step S7 to the present time is within a predetermined period of time (step S11). Note that the predetermined period of time here is a maximum time in which the foregoing accumulation error is considered to be within the range of the allowable error anticipated and the predetermined period of time here is set to 120 minutes.

As a result of this determination, if the elapsed time is within the predetermined period of time (120 minutes), a processing proceeds to the step S12. On the other hand, if the elapsed time exceeds the predetermined period of time (120 minutes), the memory effect detecting section 93 determines that the precision of the amount of change of the remaining battery charge calculated in the step S9 is low, and resets the internal timer (step S2).

Next, the memory effect detecting section 93 determines whether the present amount of change of the remaining battery charge is smaller than a predetermined value (here 30%) (step S12). At this moment, the amount of change of the remaining battery charge is calculated for the period starting after the correction of the upper limit (or lower limit) of the remaining battery charge was performed and ending when the correction of the lower limit (or upper limit) of the remaining battery charge is performed. For example, if the memory effect has not occurred, assuming that the lower limit of the remaining battery charge is 20% and the upper limit thereof is 80%, the amount of change of the remaining battery charge should be 60% if the accumulation error is not taken into account. Accordingly, if the amount of change of the remaining battery charge is a value lower than 60%, the amount of change of the remaining battery charge must be reduced due to the memory effect. Therefore, the determination of the occurrence of the memory effect is performed using this characteristic.

As a result of this determination, if the amount of change of the remaining battery charge is smaller than the predetermined value, the memory effect detecting section 93 determines that the memory effect has occurred, and notifies the use permission zone determining section 94 of the occurrence of the memory effect and the amount of change of the remaining battery charge (step S13). On the other hand, if the amount of change of the remaining battery charge is equal to the predetermined value or more, the memory effect detecting section 93 determines that the memory effect has not occurred, and does not send a notification of the occurrence of the memory effect to the use permission zone determining section 94 (step S14).

As described above, it is possible to detect the occurrence of the memory effect depending on whether the amount of change of the remaining battery charge, which is obtained from the current accumulation value in the period when the lower and upper limits of the battery voltage value are detected, is smaller than that when the memory effect has not occurred.

Next, the operation when the use permission zone determining section 94 shown in FIG. 2 determines the use permission zone of the remaining battery charge based on whether the memory effect has occurred will be described.

First, the use permission zone determining section 94 reads from the memory effect detecting section 93 the detection result indicating whether the memory effect has occurred. If the memory effect has occurred, the use permission zone determining section 94 instructs the determination voltage setting section 94b to refer to the determination voltage map used when the memory effect has occurred. The determination voltage map 90a is a map in which a voltage is defined, which determines, based on the battery temperature and the battery current, whether the correction of the remaining battery charge is to be performed.

Moreover the determination voltage map referred to when the memory effect has occurred is defined so as to increase the voltage difference between the upper and lower limits of the battery voltage value, when compared with the determination voltage map referred to when the memory effect has not occurred. In other words, with regard to the lower limit of the battery voltage, a voltage value lower than when the memory effect has not occurred, shown by the symbol C in FIG. 10, is defined. With regard to the upper limit of the battery voltage value, a voltage value higher than when the memory effect has not occurred, shown by the symbol D in FIG. 10, is defined. With such definitions, the use permission zone can be set to a range equal to when the memory effect has not occurred.

By switching the determination voltage map from one to another when the memory effect has occurred in the above described manner, the upper and lower limits of the battery voltage value compared to the steps S32 and S33 of FIG. 3 are changed. For this reason, it is possible to prevent the use permission zone of the remaining battery charge from being narrowed even when the memory effect has occurred, resulting in preventing a reduction of the time during which a continuous driving force supplementation operation of the engine and the charge operation to the battery by deceleration regeneration are available.

In the above described descriptions, the two determination voltage maps constituting the determination voltage map 91a shown in FIG. 2 are switched depending on whether the memory effect has occurred. However, three or more determination maps are provided, and the use permission zone determining section 94 selects any one of these determination voltage maps in accordance with the amount of change of the remaining battery charge. Based on this, the determination voltage set by the determination voltage setting section 91b may be changed. At this time, a threshold (30% in FIG. 4) of the amount of change of the remaining battery charge shown in step S12 of FIG. 4 is set so that it approaches a value, for example, 60%, at the time when the memory effect has not occurred. This makes it possible to further optimize the use permission zone.

Alternatively, as the determination voltage map 91a, only a map referred to when the memory effect has not occurred is adopted, and when the memory effect has occurred, a determination voltage obtained by multiplying the determination voltage, which is obtained by referring to this map, by a constant coefficient may be used. At this time, the upper limit of the battery voltage value is multiplied by a predetermined coefficient so that the upper limit of the battery voltage value has a value higher than the upper limit determination voltage stored in the map, and the lower limit of the battery voltage value is multiplied by another predetermined coefficient so that the lower limit of the battery voltage value has a value lower than the lower limit determination voltage stored in the map. With such multiplication, since only one determination voltage map is necessary, the storage capacity requirement in the remaining battery charge calculating section 91 can be reduced, and the setting processing of the determination voltage can be simplified.

Second Embodiment

Figure 5:
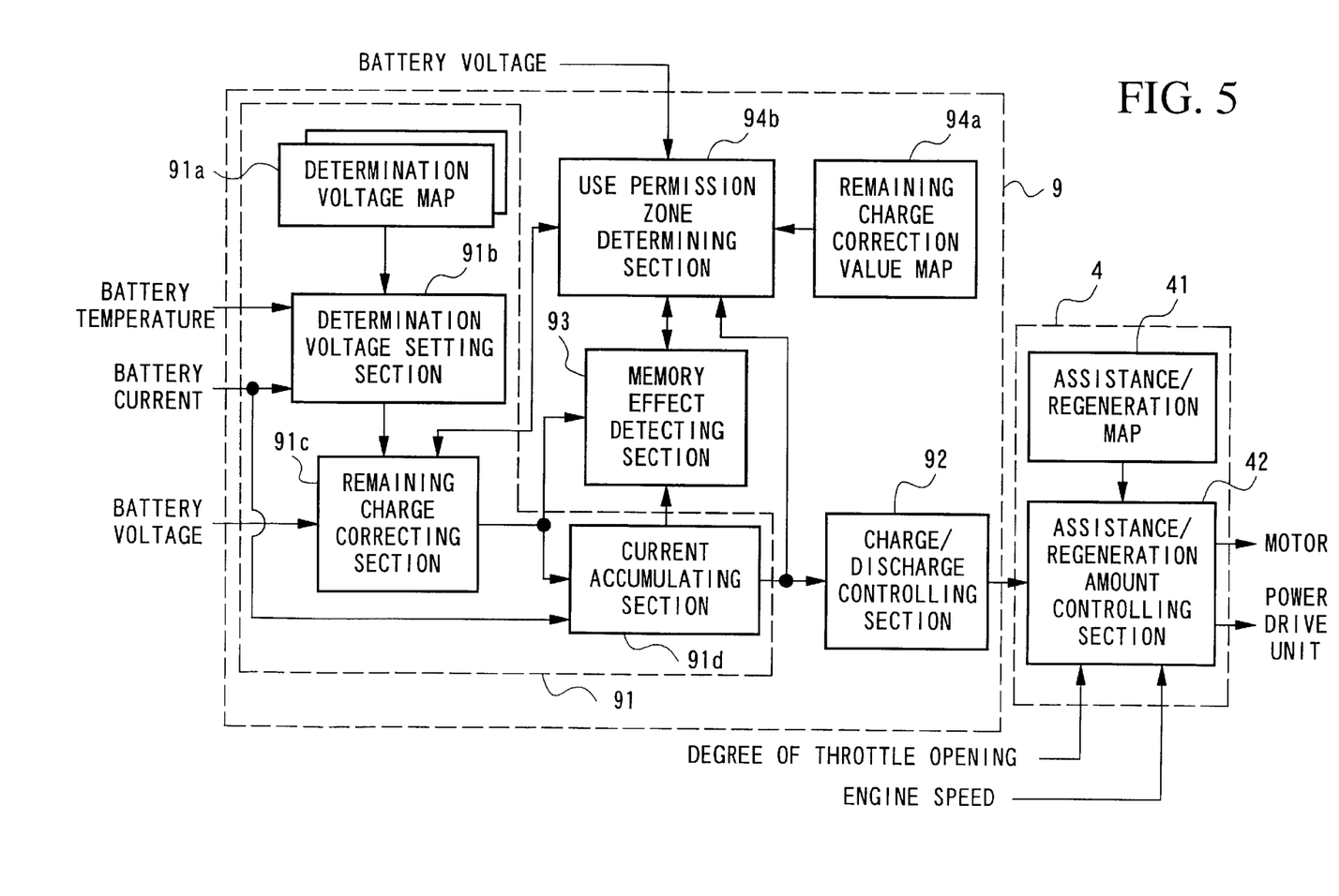
FIG. 5 is a block diagram showing the constitution of the motor control apparatus 4 and the battery control apparatus 9 shown in FIG. 1, in a second embodiment of the present invention.

Next, the battery control apparatus 9 according to a second embodiment of the present invention will be described with reference to FIGS. 5 to 7. FIG. 5 is a block diagram showing a constitution according to the second embodiment of the motor control apparatus 4 and the battery control apparatus 9 shown in FIG. 1. With regard to the battery control apparatus 9 shown in FIG. 5, constituent components identical to those of the battery control apparatus 9 shown in FIG. 2 are denoted by the same reference numerals as those shown in FIG. 2, and their explanations are omitted. The battery control apparatus 9 shown in FIG. 5 is different from the battery control apparatus 9 shown in FIG. 2 in that the remaining charge correction value map 94a is newly provided to be connected to the use permission zone determining section 94b, the battery voltage and a signal from the current accumulating section 9Id are input to the use permission zone determining section 94b, and the output of the use permission zone determining section 94b is input to the remaining charge correcting section 91c.

Figure 6:
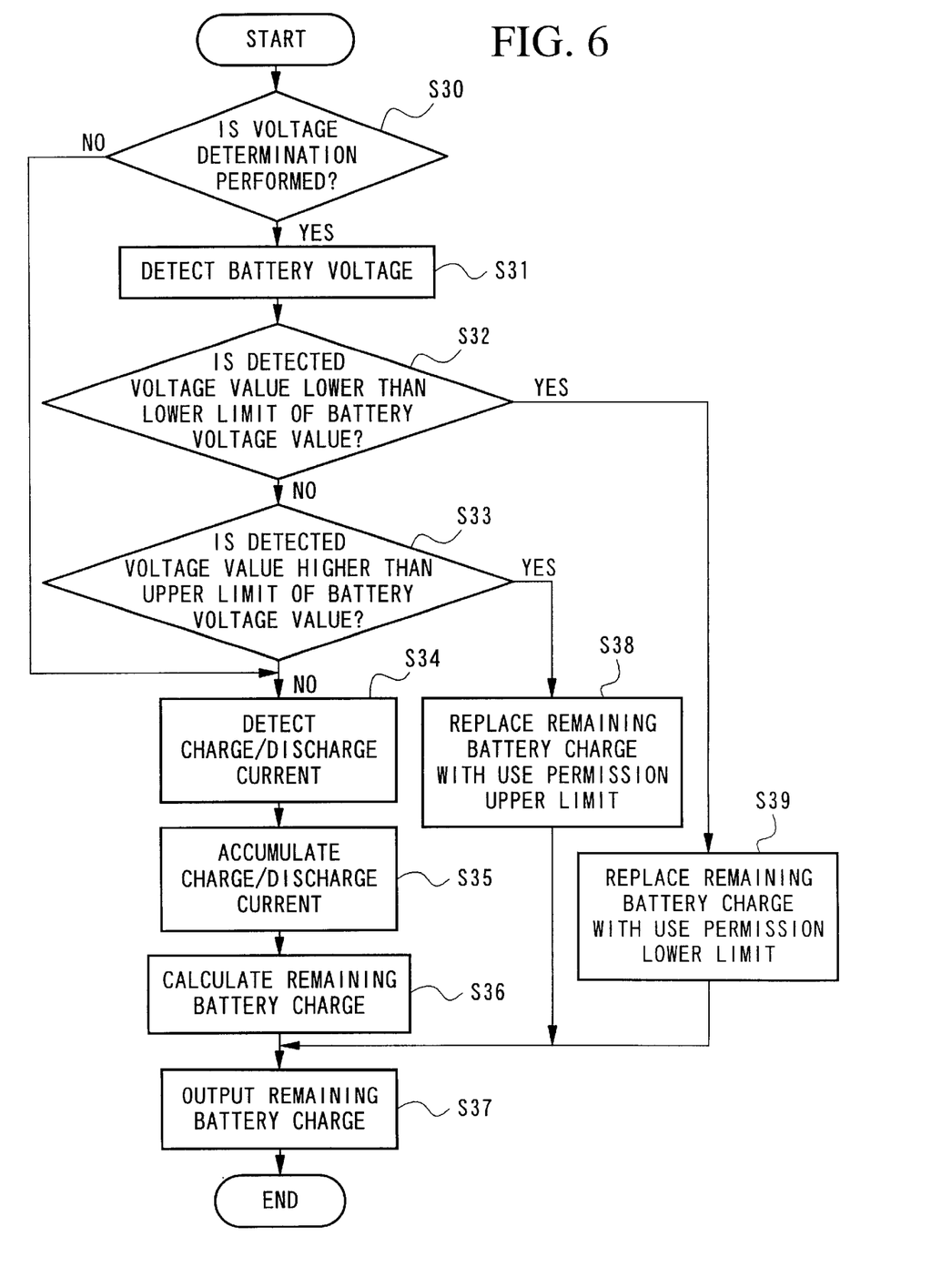
FIG. 6 is a flowchart showing an operation in which the remaining battery charge calculating section 91 shown in FIG. 5 calculates the remaining battery charge.
Figure 7:
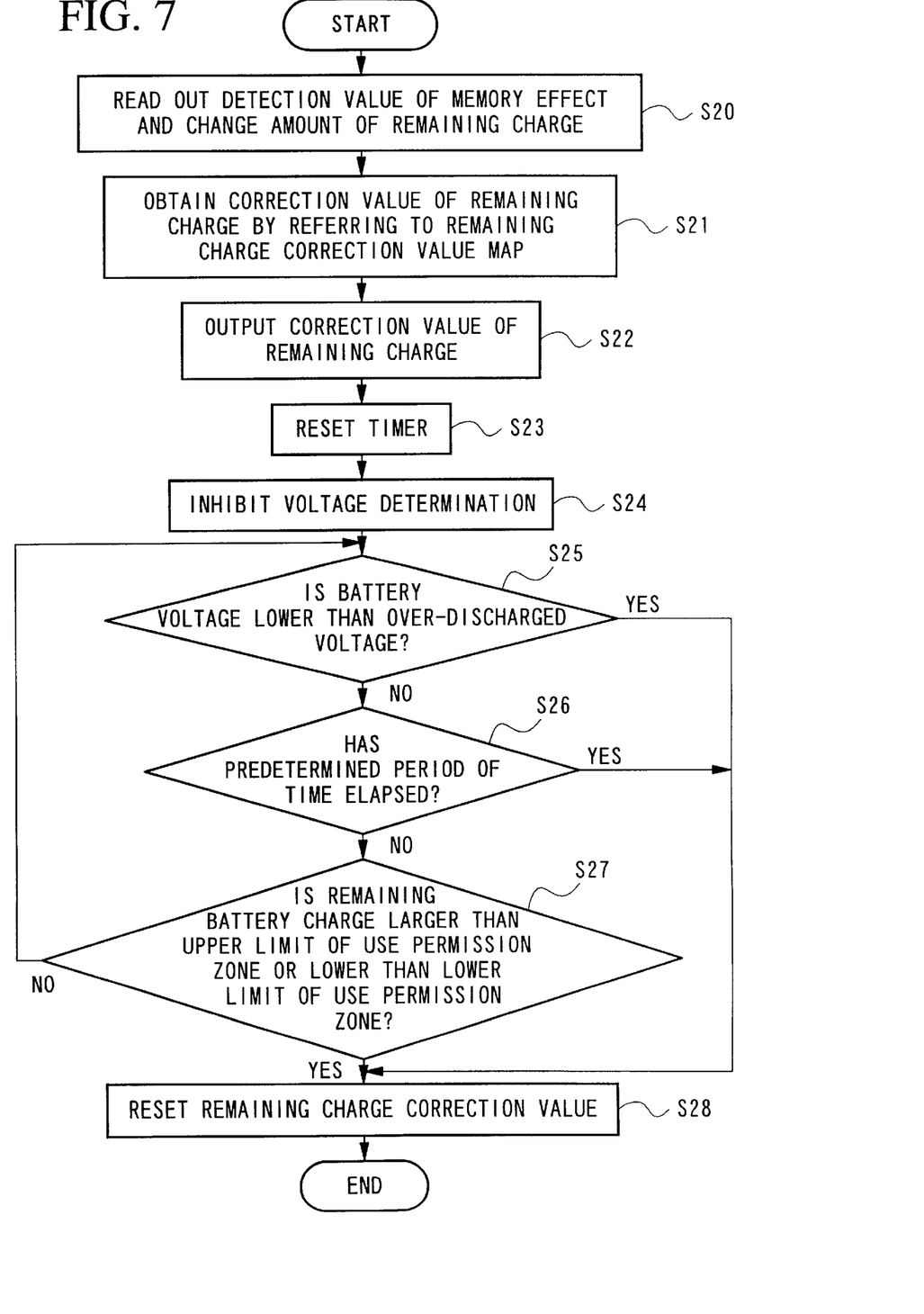
FIG. 7 is a flowchart showing an operation in which the use permission zone determining section 94b shown in FIG. 5 determines the use permission zone.

In addition, FIG. 6 is a flowchart showing the operation of the remaining battery charge calculating section 91 shown in FIG. 5. The flowchart shown in FIG. 6 is different from the flowchart shown in FIG. 3 in that a step S30 is newly provided. Moreover FIG. 7 is a flowchart showing the operation of the use permission zone determining section 94b shown in FIG. 5.

Next, the operation of the battery control apparatus 9 according to the second embodiment will be explained with reference to FIGS. 5 to 7. First, the operation of the remaining battery charge calculating section 91 will be explained with reference to FIG. 6. The remaining charge correcting section 91c determines first whether a voltage determination performed in the steps S31 to S33 will be performed (step S30). When the voltage determination is performed, the determination is performed based on an instruction indicating whether the voltage determination is performed, which is output from the use permission zone determining section 94b. As a result of this determination, if an instruction not to perform the voltage determination was output from the use permission zone determining section 94b in the step S30 shown in FIG. 6, the remaining charge correcting section 91c skips the steps S31, S32 and S33, and calculates the remaining battery charge only by the accumulation of the charge/discharge current. The remaining charge correcting section 91c does not correct the remaining battery charge.

When the remaining charge correcting section 91c skips the steps S31, S32 and S33 and does not correct (reset) the remaining battery charge by means of the battery voltage, the supervision of the remaining battery charge is performed only by the accumulation of the charge/discharge current in the remaining battery charge calculating section 91.

In addition the upper limit used for the replacement in the step S38 shown in FIG. 6 is a value determined by processing described later, and changes between 80% and 70% depending on occurrence of the memory effect. Similarly, the lower limit used for the replacement in the step S39 is a value determined by processing described later, and changes between 20% and 30% depending on occurrence of the memory effect.

Since the processing operations in the step S31 to S39 shown in FIG. 6 are the same as those explained in FIG. 3, their descriptions are omitted.

Next, the operation of the use permission zone determining section 94b will be described with reference to FIG. 5 and FIG. 7. Note that the operation of the memory effect detecting section 93 shown in FIG. 5 is the same as described according to the flowchart shown in FIG. 4. Accordingly, a description of the operation to detect the occurrence of the memory effect is omitted.

First, the use permission zone determining section 94b reads out the detection result output from the memory effect detecting section 93 and the amount of change of the remaining battery charge from the memory effect detecting section 93 (step S20).

Figure 8:
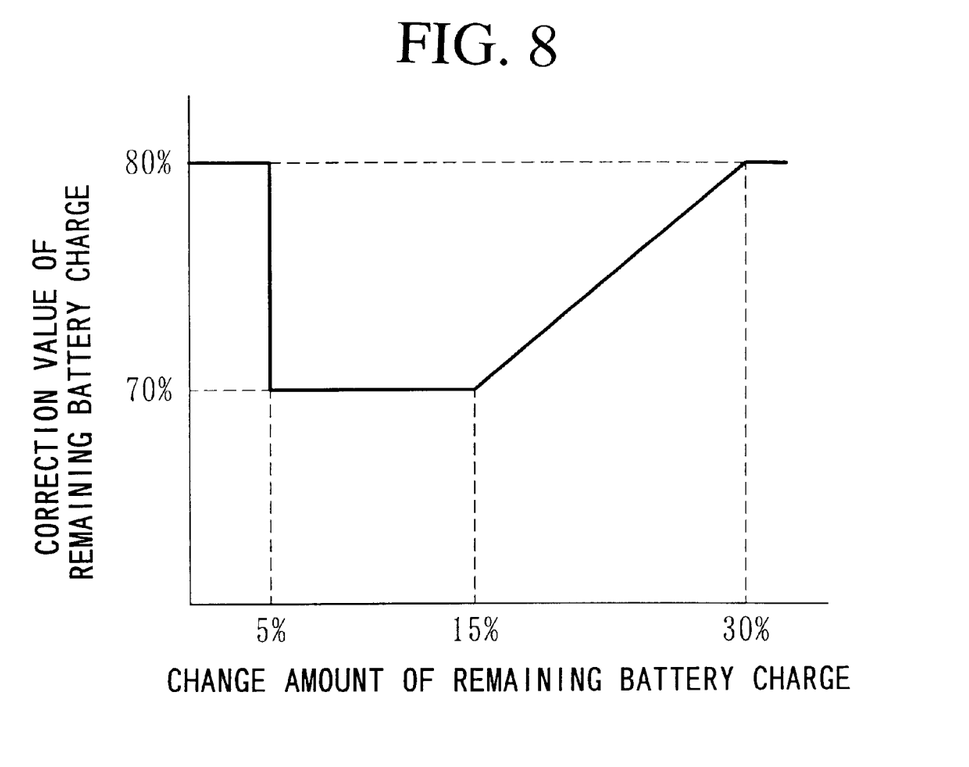
FIG. 8 is a graph showing the remaining charge correction value map 94a in which the correction values of the remaining battery charge are defined.
Figure 9:
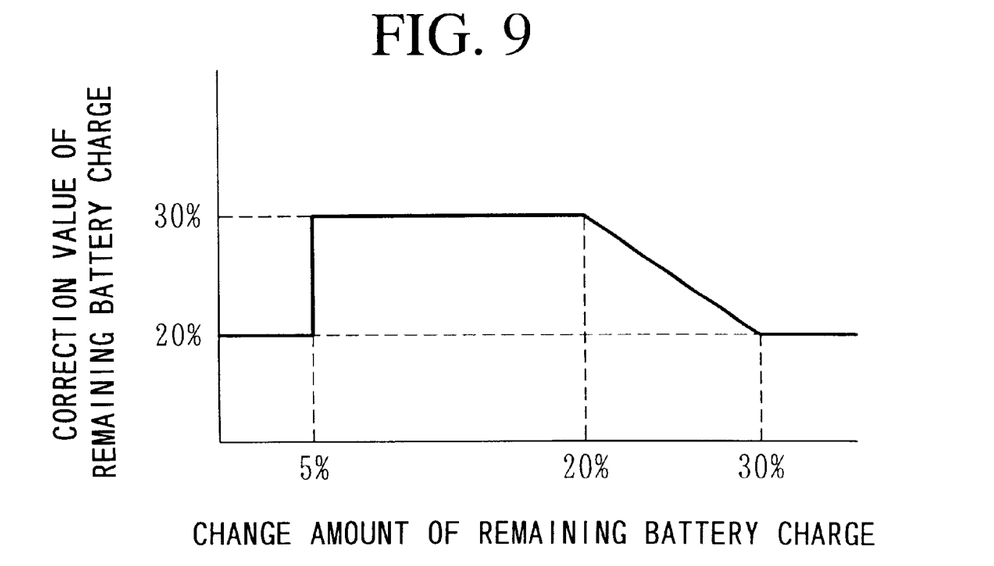
FIG. 9 is a graph showing the remaining charge correction value map 94a in which the correction values of the remaining battery charge are defined.

Next, the use permission zone determining section 94b refers to the remaining charge correction value map 94a, and obtains the correction value of the remaining battery charge corresponding to the amount of change of the remaining battery charge read out in the step S20 (step S21). The remaining charge correction map 94a referred to here is shown in FIGS. 8 and 9. In the map shown in FIG. 8, the relation between the amount of change of the remaining battery charge and the correction value of the remaining battery charge when the upper limit of the battery voltage value is detected is defined. The amount of change of the remaining battery charge is calculated by the current value accumulation between the detection of the lower limit of the battery voltage value and the detection of the upper limit of the battery voltage value.

The upper limit of the correction value of the remaining battery charge is replaced in the range between 80% and 70% with reference to this map. This value is a value used in the step S38 shown in FIG. 6. For example, when the amount of change of the remaining battery charge is 15%, the remaining battery charge is replaced by 70% when the upper limit of the battery voltage value is detected, and this value is output to the current accumulating section 91d. The remaining battery charge obtained by performing the current accumulation is corrected. Thus, the remaining battery charge that would be 80% by ordinary processing is set to 70%. Accordingly, the charge/discharge controlling section 92 determines that the remaining battery charge is lower by 10% than the upper limit (80%) of the use permission zone after correction, and permits the amount of charge equivalent to 10%.

On the other hand, the map shown in FIG. 9 defines the relation between the amount of change of the remaining battery charge and the connection value of the remaining battery charge when the lower limit of the battery voltage value is detected. The amount of change of the remaining battery charge is calculated by the current value accumulation between the detection of the upper limit of the battery voltage value and the detection of the lower limit of the battery voltage value.

The lower limit of the correction value of the remaining battery charge is replaced in the range between 20% and 30% with reference to this map. This value is a value used in the step S39 shown in FIG. 6. For example, when the amount of change of the remaining battery charge is 20%, the remaining battery charge is replaced by 30% when the lower limit of the battery voltage value is detected, and this value is output to the current accumulating section 91d. The remaining battery charge obtained by performing the current accumulation is corrected. Thus, the remaining battery charge that would have been set to 20% by ordinary processing is set to 30%. Accordingly, the charge/discharge controlling section 92 determines that the remaining battery charge is higher by 10% than the lower limit of the use permission zone, and permits the amount of charge equivalent to 10%.

Next, the use permission zone determining section 94 outputs the correction value of the remaining battery charge, which was obtained in the step S21, to the remaining charge correcting section 91c (step S22). Upon receipt of the correction value of the remaining battery charge, the remaining charge correcting section 91c corrects the use permission upper limit of the remaining battery charge or the use permission lower limit of the remaining battery charge by the correction value of the remaining battery charge output from the use permission zone determining section 94b, and notifies this correction value to the current accumulating section 91d. Upon receipt of the correction value, the current accumulating section 91d corrects the current accumulation value. At this moment, the remaining battery charge output from the current accumulation section 91d is equal to the correction value of the remaining battery charge output by the use permission zone determining section 94b. This increases the use permission zone by 10%, so that the use permission zone is enlarged and the battery approaches the completely charged state or the completely discharged state to reverse the memory effect.

Next, the use permission zone determining section 94b resets the internal timer (step S23), and instructs the remaining charge correcting section 91c not to perform the voltage determination. With this instruction, the remaining charge calculating section 91 skips the steps S31, S32 and S33 shown in FIG. 6, and calculates the remaining battery charge only based on the current accumulation.

Next, the use permission zone determining section 94b determines whether the battery voltage is lower than the over-discharged voltage or not (step 25). This over-discharged voltage is a value lower than the lower limit of the battery voltage, and the limit to which the battery 8 can discharge. If the battery voltage is lower than the over-discharged voltage, the use permission zone determining section 94b sends the remaining charge correcting section 91c an instruction to resume the voltage determination and to reset the correction value of the remaining battery charge (step S28). Upon receipt of the instruction, the remaining charge correcting section 91c resumes the voltage determination, and restores the range of the use permission, which was changed by the replacement process in steps S38 and S39, to the initial range. Thus, with regard to the remaining battery charge output from the current accumulating section 91d, the use permission lower limit is 20%, and the use permission upper limit is 80%.

On the other hand, when the battery voltage is equal to the over-discharged voltage or more, the use permission zone determining section 94b determines whether a predetermined period of time has elapsed after the correction of the remaining battery charge (step S26). For the measurement of this predetermined period of time, a time timed by the timer set in the step S23, is used. If the predetermined period of time has elapsed, the process proceeds to the step S28.

The following is an explanation of the above-described predetermined period of time. Specifically, when the upper and lower limits of the battery voltage are detected, and when the charge/discharge is repeated after changing the correction values of the upper and lower limits of the remaining battery charge to increase the use permission zone by 10% relative to the ordinary value, the determination of the battery voltage is not performed, and the supervision of the upper and lower limits is performed only by the accumulation of the charge/discharge current. For this reason, since the accumulation error becomes larger and the battery may be erroneously overcharged or over-discharged, a time set to prevent the overcharge and the over-discharge is the foregoing predetermined period of time. Here, the predetermined period of time is set to 30 minutes.

Next, if the predetermined period of time has not yet elapsed, the use permission zone determining section 94b refers to the remaining battery charge output from the current accumulating section 91d, and determines whether the value of the remaining battery charge is larger than the upper limit of the use permission zone or smaller than the lower limit thereof (step S27). If the remaining battery charge is outside of the use permission zone, the processing proceeds to the step S28. On the other hand, if the remaining battery charge is within the use permission zone, a processing is returned to the step S25, and the determination processing performed in the steps from S25 to S27 is repeated.

The examples of the remaining charge correction value map 94a shown in FIG. 5 are illustrated in FIGS. 8 and 9. However, it is not always necessary to provide the remaining charge correction value map 94a, and the correction may be performed so that the correction values of the remaining battery charge are set to be one predetermined value depending on the occurrence of the memory effect. For example, if the amount of change of the remaining battery charge is equal to 30% or lower, the correction value of the upper limit of the remaining battery charge is unconditionally set to 70%. With such a setting, since the correction value of the remaining battery charge can be changed without the provision of the remaining charge correction value map 94a, the constitution of the battery control apparatus 9 can be simplified.

As described above, while the error of the accumulation value of the charge/discharge current value is not large, if the amount of change of the remaining battery charge is smaller than an anticipated value when the upper and lower limits of the battery voltage value are detected, it is determined that the memory effect has occurred in the battery 8, and when the remaining battery charge is corrected (reset), the value is changed in accordance with the amount of change of the remaining battery charge. Therefore, the use permission zone of the remaining battery charge can be enlarged, which makes it possible to prolong the time of continuous availability for the driving force supplement operation of the engine and the charge operation to the battery by the deceleration regeneration. In addition by enlarging the use permission zone when the memory effect occurred, the battery can be made to approach to the overcharged state or the over-discharged state, so that the memory effect occurred in the battery 8 can be reversed.

Moreover if a new battery is used, the possibility of occurrence of the memory effect increases. Accordingly, the presence of the memory effect is determined depending on conditions such as the use time of the battery, the running time of the vehicle, the accumulated charge/discharge current and the running distance of the vehicle. In addition, when these conditions are satisfied, the replacement of the foregoing correction value of the remaining battery charge and the replacement of the determination voltage of the remaining battery charge may be performed. Moreover, by performing the replacement of the correction value of the remaining battery charge and the replacement of the determination voltage of the remaining battery charge, and by running the vehicle after enlarging the use permission zone, the memory effect should be reversed. Accordingly, in accordance with the conditions such as the use time of the battery, the running time of the vehicle, the accumulated charge/discharge current and the running distance of the vehicle, it may be determined whether the memory effect has been reversed. Thus, it is possible to simplify the memory effect detection processing shown in FIG. 3.

The present invention has been demonstrated above with reference to the drawings, but the specific detailed structures are not limited to those shown in the diagrams, and modifications of the basic design principle outlines in the present invention are intended to be included in the specific examples demonstrated.

What is claimed is:

1. A battery control apparatus for a hybrid vehicle with a combustion engine for outputting driving force of the vehicle, an electric motor for generating a force for assisting the output from said engine, and a battery for supplying power to said motor and for storing energy regenerated by said motor acting as a generator when the assisting force is not required, said battery control apparatus comprising:

a remaining battery charge calculator for calculating a remaining charge of said battery;

a memory effect detector for detecting the occurrence of the memory effect in said battery;

a use permission zone determining device for determining a use permission zone of the remaining charge of said battery in accordance with the occurrence of said memory effect; and a charge/discharge amount controller for controlling an amount of charge/discharge in the use permission zone of the remaining charge of said battery.

2. A battery control apparatus according to claim 1, further comprising:

a remaining battery charge correcting device for detecting a voltage of said battery, comparing the detected voltage with a determination voltage corresponding to the remaining battery charge of a predetermined value, and correcting the remaining charge calculated by said remaining battery charge calculator to said predetermined value based on the comparison result of said detected voltage and said determination voltage, wherein, said use permission zone determining device changes said determination voltage when said remaining battery charge is corrected, in accordance with the occurrence of the memory effect.

3. A battery control apparatus according to claim 1, further comprising:

a remaining battery charge correcting device for detecting a voltage of said battery, comparing the detected voltage with a determination voltage corresponding to the remaining battery charge of a predetermined value, and correcting the remaining charge calculated by said remaining battery charge calculator to said predetermined value based on the comparison result of said detected voltage and said determination voltage, wherein, said use permission zone determining device changes said predetermined value of said remaining charge when said remaining charge of said battery is corrected, in accordance with the occurrence of the memory effect.

\* \* \* \* \*